(12) United States Patent
Guetta et al.

(10) Patent No.: US 9,927,210 B2
(45) Date of Patent: Mar. 27, 2018

(54) LASER DAYLIGHT DESIGNATION AND POINTING

(71) Applicant: SHILAT OPTRONICS LTD., Rehovot (IL)

(72) Inventors: Avishay Guetta, Rehovot (IL); Michael Yagudaev, Beit Hashmonai (IL); Doron Korngut, Modi'in (IL)

(73) Assignee: SHILAT OPTICAL SYSTEMS LTD., Rehovot (IL)

( * ) Notice: Subject to any disclaimer, the term of this patent is extended or adjusted under 35 U.S.C. 154(b) by 0 days.

(21) Appl. No.: 15/449,963

(22) Filed: Mar. 5, 2017

(65) Prior Publication Data

US 2017/0241746 A1 Aug. 24, 2017

Related U.S. Application Data

(63) Continuation of application No. 13/515,863, filed as application No. PCT/IL2010/001057 on Dec. 14, 2010, now Pat. No. 9,590,000.

(60) Provisional application No. 61/283,997, filed on Dec. 14, 2009, provisional application No. 61/282,243, filed on Jan. 7, 2010.

(51) Int. Cl.
| | |
|---|---|
| *G01C 3/08* | (2006.01) |
| *F41G 7/22* | (2006.01) |
| *G01S 17/32* | (2006.01) |
| *G01S 7/491* | (2006.01) |
| *G01S 17/89* | (2006.01) |
| *H01L 27/146* | (2006.01) |
| *H01L 27/148* | (2006.01) |

(52) U.S. Cl.
CPC ......... *F41G 7/2293* (2013.01); *F41G 7/2246* (2013.01); *G01S 7/4914* (2013.01); *G01S 17/32* (2013.01); *G01S 17/89* (2013.01); *H01L 27/148* (2013.01); *H01L 27/14643* (2013.01)

(58) Field of Classification Search
CPC ......... G01C 3/08; G01S 17/89; G01S 7/4817; G01S 17/42
See application file for complete search history.

(56) References Cited

U.S. PATENT DOCUMENTS

| | | | | |
|---|---|---|---|---|
| 5,006,721 A | * | 4/1991 | Cameron | G01S 7/4817 250/559.16 |
| 2010/0302282 A1 | * | 12/2010 | Dobbie | F41G 1/35 345/666 |

* cited by examiner

*Primary Examiner* — Samantha K Abraham
(74) *Attorney, Agent, or Firm* — Daniel J. Swirsky; AlphaPatent Associates Ltd.

(57) ABSTRACT

A laser designator system using modulated CW laser diodes and a conventional high pixel count image sensor array, such as CCD or CMOS array. These two technologies, diode lasers and imaging sensor arrays are reliable, widely used and inexpensive technologies, as compared with prior art pulsed laser systems. These systems are distinguished from the prior art systems in that they filter the laser signal spatially, by collecting light over a comparatively long period of time from a very few pixels out of the entire field of view of the image sensor array. This is in contrast to the prior art systems where the laser signal is filtered temporarily, over a very short time span, but over a large fraction of the field of view. By spatially filtering the signal outputs of the individual pixels, it becomes possible to subtract the background illumination from the illuminated laser spot.

22 Claims, 5 Drawing Sheets

LASER DAYLIGHT DESIGNATION AND POINTING

CROSS-REFERENCE TO RELATED APPLICATIONS

This application is a continuation of U.S. patent application Ser. No. 13/515,863, which is a U.S. National Phase Application under 35 U.S.C. 371 of International Application No. PCT/IL2010/001057, filed Dec. 14, 2010, which claims the benefit of priority from U.S. Provisional Patent Application No. 61/283,997, filed Dec. 14, 2009, and U.S. Provisional Patent Application No. 61/282,243, filed Jan. 7, 2010, the contents of all of which applications are incorporated herein by reference in their entirety.

FIELD OF THE INVENTION

The present invention relates to the field of laser designation and pointing systems, especially for use in daylight and using low-cost, CW diode laser sources.

BACKGROUND OF THE INVENTION

Laser designator and pointing systems are widely used systems which use the spatial optical detection of a reflected laser beam in the imaged field of view in order to pin-point the target to be designated. In low illumination situations, this task is comparatively simple since the laser illuminated target stands out well from the background. However, the main challenge of laser pointing and designator systems is to be able to recognize the laser signal reflected from the field of view being surveilled, while the field of view is bathed in daylight background illumination. The intensity of the sun's illumination may be orders of magnitude larger than that of a low average power laser beam directed into the field from a distance, making detection of the laser beam reflection difficult.

Current laser pointing and designator systems generally use a pulsed solid state laser, often a Nd:YAG laser, for illuminating the target. The pulse width is typically on the order of 20 to 50 ns, and for a laser having an average power of a few watts, this means that the peak power of the pulses is of the order of many tens of megawatts. The solar radiation deposits approximately 1 kW per square meter. The use of a wavelength discriminating filter in order to limit the detected background to the wavelength range of the laser pulses, may reduce this flux by a factor of some tens or even one hundred. Consequently the peak power of the laser beam may be a factor of tens of thousands larger than the solar radiation detected in the wavelength window admitted by the system filter. Consequently, it is a comparatively simple matter to detect the flash of a laser pulse from the illuminated background of the field of view. Furthermore, a gated detection system synchronized to the short laser pulses, may be used, such that only the reflected light of the pulses is detected, thereby rejecting the majority of the background shot-noise.

Figure 1:
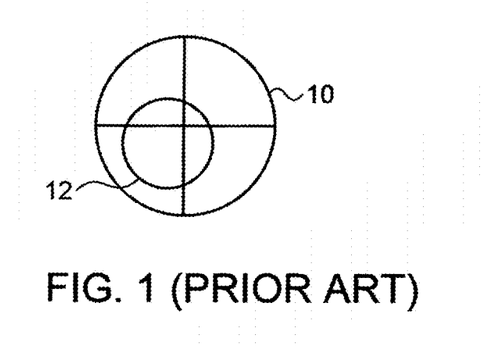
FIG. 1 illustrates schematically a prior art quadrant detector.

The spatial position of the reflected laser pulse is typically determined by use of a quadrant photodiode, as shown in FIG. 1. The received light is imaged onto the quadrant detector thus providing directional information as to where the spot is in relation to the center of the imaged field of view. In more advanced versions of quadrant detectors, a comparatively large spot can be used, and an algorithm comparing the output of the various quadrants is used to approximately determine the location of the reflected laser beam in the actual field of view. The lack of more detailed information about the position of the laser spot in the field of view has led to guidance systems for munitions homing onto the laser designator, which cause the projectile to perform a number of decreasing oscillations during its path towards the target. One such system is described in U.S. Pat. No. 6,097,481 assigned to the Northrop Grumman Corporation, and known as the "Bang Bang Laser Spot Tracker".

Various schemes of temporal coding such as changing the spaces between the pulses, can be used, both in order to discriminate between different designators, and in order to avoid simple countermeasures from interfering with the system.

This technology requires a high peak power pulsed laser, in order to enable a sufficient level of energy for detection above the background level. Such lasers generally have a number of disadvantages, in that they have complex, fragile structures, comparatively large dimensions, limited reliability and lifetime, and are a high cost item. As a result, laser designators and pointers are not widely used, and in those cases where use is made of them it is generally by dedicated personnel and units There therefore exists a need for a laser designation and pointing system, which overcomes at least some of the disadvantages of prior art systems and methods, and in particular, capable of operating in full sunlight, yet without the need to use a high peak power, pulsed laser source. In addition there exists a need for a substantially lower cost laser designation and pointing system, such that wider use can be made of such systems.

The disclosures of each of the publications mentioned in this section and in other sections of the specification, are hereby incorporated by reference, each in its entirety.

SUMMARY OF THE INVENTION

As an alternative to the complicated and expensive prior art pulsed laser systems, the present disclosure describes new exemplary laser pointer and designator systems using modulated CW laser diodes and a conventional high pixel count image sensor array, such as CCD or CMOS array. These two technologies, diode lasers and imaging sensor arrays are reliable, widely used and inexpensive technologies, as compared with the prior art methods of using a pulsed laser system.

These novel systems are distinguished from the previously described prior art systems in that they filter the laser signal spatially, by collecting light over a comparatively long period of time from a single pixel or a few pixels out of the entire field of view of the image sensor array. This is in contrast to the prior art systems where the laser signal is filtered temporarily, over a very short time span, but over a large fraction of the field of view. The difference between the presently described quasi-CW systems and the prior art pulsed systems can be summarized in table I below:

TABLE I

|  | Prior art Pulsed | CW system proposed |
|---|---|---|
| Exposure time | Very short (≈ns) | Long (≈ms) |
| Spatial resolution (pixels) | Few (Quad) | Entire array (CCD/CMOS) |

The background shot noise is present in these two technologies at a similar level. However, while the prior art pulsed laser system filters temporally, by detecting the pulse presence in a very short time window, the CW based system of the present disclosure filters spatially, by detecting signals in only a few of the pixels of the complete array.

Unlike the short-pulsed, solid-state lasers used in the prior art systems, which are generally Q switched, typical CW laser diodes are really CW sources which are switched on and off at their CW rated output, at a comparatively slow rate. Such CW laser diodes are generally "pulsed" on and off at a rate of up to around 20 Hz, corresponding to a pulse width of the order of 50 ms. Therefore, compared with the typical prior art 50 ns laser pulses, during each laser pulse, the detector receives about $10^6$ times more background energy than in prior art systems. However, if instead of using a quadrant detector with four pixels, a four megapixel array is used, then this background energy will be spread over $10^6$ times as many pixels as compared with the prior art quadrant detector system. Therefore each pixel of the array used in the system of the present application actually receives the same level of background radiation as each complete quadrant of the prior art detector. Since the laser designation spot can be very small, the reflected laser light from the point in the field of view at which the laser impinged, may cover only one or a very few pixels in the imaging array. Therefore although the "peak" power of the pulsed CW laser may be a factor of $10^6$ less than that of the prior art short pulsed laser, the signal-to-noise ratio in any single or small number of pixels is similar to that of the prior art, short-pulsed lasers. Therefore in effect, the detection arrangement of the present described system uses a multi-pixel array to convert the time discrimination used in prior art, short-pulsed systems, to a spatial discrimination based system. Expressed otherwise, the detection arrangement of the present system collects the reflected laser light over a very small area for a long time, while the prior art short-pulsed systems collects the reflected laser light for a very short time over a large area. For the reasons stated above, so long as the reflected laser beam is sufficiently small that it is imaged only on one or very few pixels, the signal to noise ratio per pixel remains of the same order, such that the detection sensitivity is essentially no different in the two cases.

The prior art, short pulsed systems discriminate between the reflected light and the background since the peak energy of the short laser pulses is so high that no background effects can occur at that level, and simple level discrimination can be used to distinguish the reflections of the pulsed laser from any background effects. Temporal gating may also be used to increase the discrimination from the background. The CW-based technology of the present disclosure, on the other hand, is much more sensitive to background reflections, since the "peak" power of the laser pulses is no more than the typically few watts of its CW output. Consequently, bright objects in the field being viewed, such as scattered sunlight, or the headlights of a vehicle, can illuminate at the same brightness as the CW laser spot itself, or even more, and may cause false alarms. Therefore some form of discrimination of true reflected signals from the background must be adopted in order to use such CW lasers in designation and pointing systems.

In order to achieve this discrimination, it is important that the characteristics of the reflected laser light signal be different from those of the background reflections. Since the desired reflected laser signals, in terms of power level, possible positions in the field of view, and integration time in the system are very similar to those characteristics of the background signal, one method of ensuring discrimination between the reflected laser signal and the background is by means of temporal differences impressed onto the laser beam, in the form of pulsing. This pulsing can also include temporal coding such as changes in the frequency of the pulse rate, in order to provide immunity of the system from outside interference, jamming or countermeasures.

It is important that any such modulation applied be at a frequency which is different from changes which may occur in the background illumination. Typical changes in the environment due to natural movements occur at up to about 50 Hz, which is also the approximate limit of frequency resolution of the eye. Changes due to moving land vehicles can occur at up to about 100 Hz. Changes due to atmospheric turbulence can occur at frequencies of up to about 500 to 1000 Hz. These are the quickest changes which can occur in nature, such that the temporal coding method needed to distinguish from the background changes must be at a frequency of at least 1 kHz. In order to ensure clear discrimination, especially since such systems may be used in guided weapons where accuracy is essential to avoid collateral damage, a frequency of a few kilohertz should thus optimally be used. It is comparatively straightforward to modulate the laser at several kilohertz, but it is a much more difficult undertaking to be able to read each of several megapixels in an imaging array at that rate. However, there do exist high pixel count detector arrays which can operate at that frequency, including electronic address circuitry for reading the pixels of such an array.

The simplest method of detecting the modulated laser signals in each pixel would be to provide each pixel with a bandpass filter which would allow only signals at the laser modulation frequency to be detected. However an electronic filter for such an array would be very difficult to implement, and would be limited to a predefined modulation frequency. Therefore a digital bandpass filter scheme is proposed in order to detect the reflected modulated laser beam at each pixel.

According to the Nyquist sampling theory, in order to detect a modulated laser beam, it is necessary to sample it at a frequency of at least twice the modulation frequency. The beam is thus sampled at an image sensor rate which is a multiple of the laser modulation coded rate, such that by subtracting samples separated from each other by half of the laser modulation period, the background, which does not change appreciably from sample to sample, is subtracted out, while the laser reflection, leaves a net measured intensity change between the samples. By this means it becomes possible to identify the pixels which have detected a reflected laser beam signal from the general slowly changing background illumination level. The details by which this is achieved are described hereinbelow in the detailed description section of this disclosure.

An image, as described above, including only the position of the laser designating spot, is known as a seeker image, and is used in simple homing devices without user control or intervention. However there exist many situations in which a "see-spot" image is required, showing the complete imaged field of view with the designation laser spot impressed on it, so that the operator can see what is being designated in the context of the entire field of view, and can also see the shape of the spot itself. Both of these aspects are important in adapting the system for use by less trained personnel. Furthermore within the entire field of view, the see-spot image is able to show any number of laser designating spots impinging within the imaged area, and to distinguish between them by use of the special coding methods described in detail hereinbelow, that enable differentiation between different designators. The imaged spots can be intensified by use of suitable image processing routines. An additional advantage is that, unlike the prior art very short pulse laser designators, in which the very high peak power of the pulses can blind any detector device imaging the field of view, the imaging devices used with the quasi-CW pulses of the presently described systems are immune to blinding.

Such a see-spot image can be obtained with the systems described in the present disclosure by adding the samples separated from each other by half of the laser modulation period. An image of the field of view is obtained including the position of the laser, though the latter may be difficult to see against the background of the field of view. However signal processing techniques can be used to combine the image of the reflected laser beam obtained from the difference samples, with this complete field of view image obtained from the summed samples, and thus to provide an image of the complete field of view with the laser designation spot clearly visible on it. This see-spot implementation is therefore very important where there exist orders forbidding the fire of smart munitions without the operator being able to see the designated target in the context of the complete field of view. Furthermore, this implementation also enables use of laser designation by a wider range of personnel, without the need of the highly specialized training needed hitherto by laser designator operators who did not have the advantages of see-spot imaging. Where a complete field of view image is available, any anomalies in the laser spot itself observed by the operator, such as resulting from the spot impinging on the edge of a wall, or at a high glancing angle with the target, or going through an opening in the target, can immediately be detected. Using the more complete information provided by the see-spot image, in situations where collateral damage may occur, a decision to abort the munition can be taken at the field level and without delay. Identity of the shape of the spot can be performed automatically by means of suitable software.

Although the systems have been described above using a laser modulated at a fixed frequency rate, it is also possible to use other modulation schemes in order to characterize the laser pulses, such as digitally coded series of modulation pulses, and it is to be understood that the invention is equally applicable to such modulation schemes also.

Imaging arrays and their associated circuitry operating in the kHz range and higher are non-standard devices and of high cost. In order to be able to use inexpensive, conventional 20 frame per second CCD's for the imaging array, instead of the costly and non-standard multi-kHz types, a system is described wherein use is made of a CCD or a CMOS having pixels with two charge registers that can be alternately filled at a rate in the kHz region. The signal is collected by one charge register, while the background is collected equally by both. Subtracting the two charge registers filters the background from the signal, leaving the reflected laser signals, which have been detected at the kHz range modulation rate of the laser, and yet have been read out of the CCD device at its tens of Hz frame rate.

One example implementation involves, a system for imaging a remote object, the system comprising:
(i) a CW laser source, modulated at a modulation frequency to provide an output stream of laser pulses, the pulses being temporally separated from each other by the modulation period, and the stream comprising pulses of laser illumination temporally separated by spaces without laser illumination,
(ii) a transmitter optical assembly for sending a beam of the laser pulses towards the remote object,
(iii) a multi-pixel, 2-dimensional image sensor array,
(iv) a receiver optical assembly for receiving laser pulses reflected from the remote object, and imaging them onto the multi-pixel image sensor array, and
(v) a signal processor, sampling the signal outputs from at least one pixel of the sensor array at a sampling rate at least twice that of the modulation frequency, and outputting the difference between the signal output arising from samples temporally separated from each other by half of the modulation period,
(vi) wherein the difference outputted by the signal processor is representative of the laser illumination reflected from the object without the background illumination reflected from the object.

In such a system, a first signal output sampled by the signal processor may arise from the illumination reflected from at least one laser pulse, and a second signal output temporally separated from the first signal output by half of the modulation period may arise from at least one space without laser illumination. In such a case, the difference enables the laser illumination reflected from the object to be determined even when the background illumination reflected from the object is at least of the same order as that of the reflected laser illumination.

In any of the above described systems, the modulation frequency may be substantially higher than the rate of change in background illumination occurring in the region of the object, such that the background illumination does not change appreciably between successive samples. The modulation frequency may be at least 500 Hz. The signal processor may sample the signal outputs from many pixels of the sensor array, such that an image may be obtained of the many pixels, the image showing the laser illumination reflected from the object without the background illumination.

Additionally, in such systems, the signal processor may be further adapted to output the sum of the signal outputs arising from samples temporally separated from each other by half of the modulation period, and the sum outputted by the signal processor may be representative of the laser illumination reflected from the object impressed upon the background illumination reflected from the object. In such a case, the signal processor may sample the signal outputs from many pixels of the sensor array, such that an image may be obtained of the many pixels, the image showing the laser illumination reflected from the object together with the background illumination. The position of the laser illumination reflected from the object may then need to be emphasized by signal processing so that it becomes more visible above the background illumination.

Yet other implementations may involve a method of imaging a remote object disposed in an illuminated field of view, the method comprising:
(i) illuminating the object by means of a CW laser beam modulated at a frequency to provide an output stream of laser pulses,
(ii) imaging the field of view using a multi-pixel 2-dimensional image sensor array,
(iii) outputting the signals obtained from a plurality of the pixels during the duration of the pulses of a part of the stream of laser pulses, to obtain a first image output of those pixels,
(iv) outputting the signals obtained from that plurality of the pixels during the duration of the time between the pulses of that part of the stream of laser pulses to obtain a second image output, and (v) subtracting the second image output from the first image output, such that the image output of the illuminated field of view is subtracted from the image output of the illuminated object.

In such a method, the signals obtained from the plurality of pixels during the duration of the pulses of a part of the stream of laser pulses may be transferred to a first set of charge registers, and the signals obtained from the plurality of pixels during the duration of the time between the pulses of that part of the stream of laser pulses may be transferred to a second set of charge registers, the method comprising the further step of reading out the first and second set of charge registers at a rate substantially less than that of the modulation frequency. In such a case, each of the pixels may have associated with it a single charge register, the signals on alternate pixels being transferred to their associated charge register in synchronization to the modulation frequency, such that alternate charge registers collect—(a) the charges due to signals obtained from the pixel during the duration of the pulses, and (b) the charges due to signals obtained from the pixel during the duration of the time between the pulses.

Furthermore, each of the pixels may alternatively have associated therewith a pair of charge registers, one associated with the first set of charge registers, and the other associated with the second set of charge registers.

In either of the above cases, the read out rate may be compatible with the frame rate of standard CCD or CMOS devices, and could be 30 Hz or less.

Additional implementations may involve a method as described above, in which the first image output is obtained from the first set of charge registers, and the second image output is obtained from the second set of charge registers, such that subtraction of the read out charges from the two sets of charge registers provides the image output of the illuminated object without the effect of the illuminated field of view. In any of these methods, the modulation frequency may be substantially higher than the rate of change in the illuminated field of view occurring in the region of the object.

According to a further implementation, there is presented a method wherein the signals from any pixel during the duration of pulses of a part of the stream are transferred to a first charge register of a progressive scan CCD, the method further comprising the steps of shifting the vertical register of the progressive scan CCD such that the signals from that pixel during the duration of the time between the pulses of that part of the stream are transferred to a second charge register, and reading out the first and second charge registers at a rate substantially less than that of the modulation frequency.

Another example implementation can involve a system for imaging a remote object, the system comprising:
(i) a CW laser source, modulated with a scheme to provide an output stream of laser pulses, the pulses being temporally separated from each other by the modulation scheme, and the stream comprising pulses of laser illumination temporally separated by spaces without laser illumination,
(ii) a transmitter optical assembly for sending a beam of the laser pulses towards the remote object,
(iii) a multi-pixel, 2-dimensional image sensor array,
(iv) a receiver optical assembly for receiving laser pulses reflected from the remote object, and imaging them onto the multi-pixel image sensor array, and
(v) a signal processor, sampling the signal outputs from at least one pixel of the sensor array at a sampling rate at least twice that of the modulation scheme, and outputting the difference between the signal output arising from samples temporally separated from each other by half of the modulation scheme,
(vii) wherein the difference outputted by the signal processor is representative of the laser illumination reflected from the object without the background illumination reflected from the object.

Yet another implementation perform a method for determining the range of an object, comprising:
(i) illuminating the object by means of a CW laser beam modulated at a first frequency to provide an output stream of laser pulses,
(ii) imaging the field of view using a multi-pixel 2-dimensional image sensor array,
(iii) sampling signals reflected from the object obtained on at least one pixel during the duration of the pulses at a second frequency different from the first frequency to obtain a first signal output set at the frequency equal to the difference between the first and second frequencies,
(iv) sampling the signals obtained on at least one pixel during the duration of the of the time between the pulses at that second frequency to obtain a second signal output set at the frequency equal to the difference between the first and second frequencies,
(v) subtracting one of the signal output sets from the other to provide a difference output signal at the frequency equal to the difference between the first and second frequencies, and
(vi) determining the range of the illuminated object from the change in phase detected in the output signal at the frequency equal to the difference between the first and second frequencies.

BRIEF DESCRIPTION OF THE DRAWINGS

The presently claimed invention will be understood and appreciated more fully from the following detailed description, taken in conjunction with the drawings in which:

DETAILED DESCRIPTION

Reference is now made to FIG. 1, which illustrates schematically a prior art quadrant detector 10, showing a detected reflected laser spot 12 on the quadrant detector, enabling use of a comparative intensity algorithm to determine the position of the object in the field of you from which the laser beam was reflected. As is observed the quadrant detector has essentially only four pixels.

Figure 2:
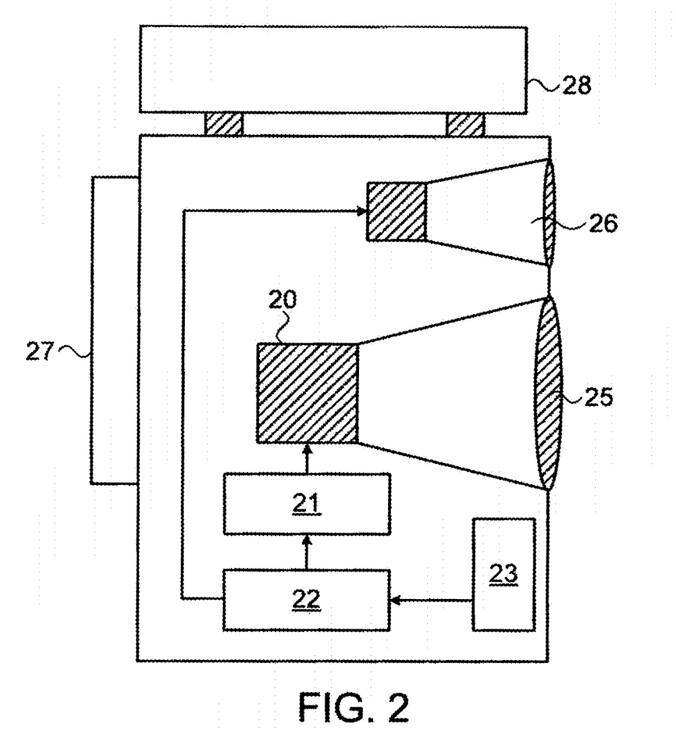
FIG. 2 illustrates schematically an exemplary transmitter architecture for implementing laser designating and positioning systems of this application.
Figure 3:
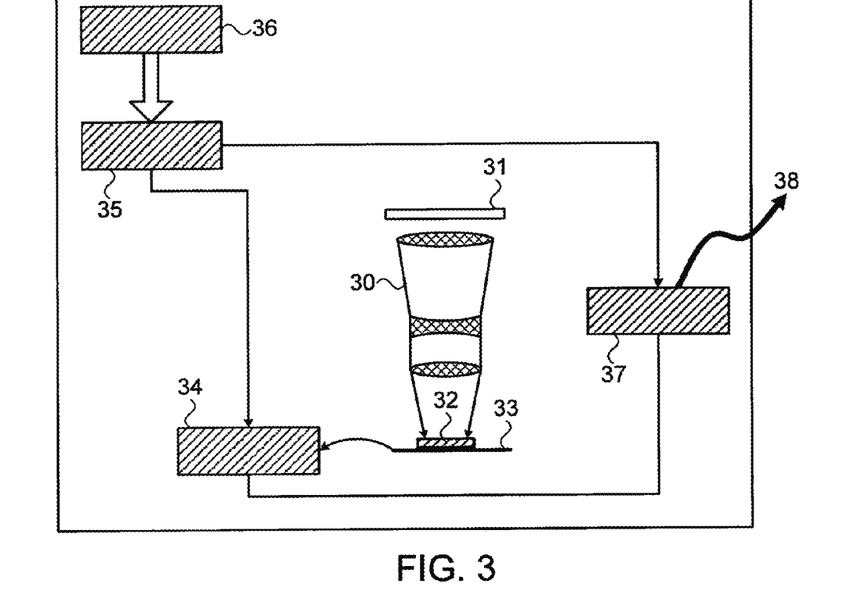
FIG. 3 illustrates schematically an exemplary receiver for implementing laser designating and positioning systems of this application.

Reference is now made to FIGS. 2 and 3, which respectively illustrate schematically exemplary transmitter and receiver architectures for implementing the laser designating or pointing systems described in this application.

In FIG. 2, there is shown a block diagram of an exemplary transmitter for use in the systems of this disclosure. The laser diode module 20 transmits its output beam through a beam expander and objective lens 25. The laser driver 21 is controlled by means of controller 22 which determines the pulse modulation of the laser. A battery 23 provides power for the transmitter module. A seeker module 26 can be provided in order to view the target which is being illuminated by the transmitter, to ensure that the illuminating beam is falling on the correct target. A viewfinder 28 may be supplied to provide the operator with a visual view of the seeker image of the target to be designated. As an alternative, an optical telescope, previously boresighted with the laser transmitter, can be used to ensure target accuracy. The controllers and indicators for operating the transmitter are contained in the control panel 27.

In FIG. 3 there is shown a block diagram of an exemplary receiver for use in the systems of this disclosure. The received laser beam is imaged by the lens assembly 30 onto the imaging sensor array 32, which can be a CCD or a CMOS array, mounted on its circuit board 33. The signals from the imaging circuit board 33 are input to a signal processing module 34, driven by a DC power supply 35 powered by a battery 36. The output from the signal processing module 34 is input to a video controller 37 from where the output of 38 is sent to the operator's viewing screen or other viewing device. A spectral filter 31 is disposed in front of the lens assembly 30, in order to provide entry only to light in the spectral region of the known laser wavelength.

Figure 4A:
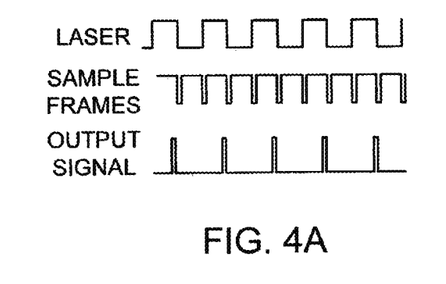
FIGS. 4A and 4B illustrate a method of subtracting alternative samples to identify pixels which have detected a reflected modulated laser beam signal, and to discriminate from the slowly varying background illumination level.
Figure 4B:
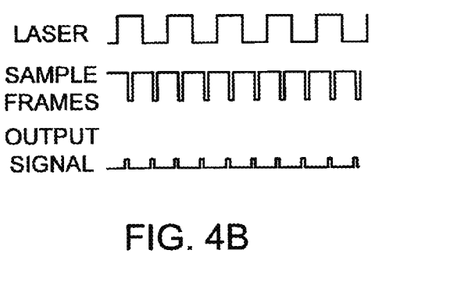

Reference is now made to FIGS. 4A and 4B, which illustrate how the method of subtracting alternate samples from each other enables the identification of pixels which have detected a reflected modulated laser beam signal, and the discrimination of that signal from the slowly varying background illumination level. As previously intimated in the Summary section of this disclosure, a modulation frequency of the order of a few kilohertz is required in order to discriminate detected laser signals from the fastest varying background signals generally encountered. FIGS. 4A and 4B illustrate the minimal case where the sampling rate is exactly twice the laser modulation rate. Such a factor would require good synchronization between the laser and the image sensor rate, with no significant phase difference between them. To explain this, reference is made to FIG. 4A, where the top trace shows the transmitted laser signal, while the middle trace shows the detector exposure at twice the laser modulation frequency, correctly phased with the laser modulation, while the output signal, which is a difference between the signal being sampled and that of the previous one, is shown in the bottom trace. The output signal is shown in these figures as a single integrated pulse at the end of each sample. Because of the synchronization, the subtracted output signals appearing in alternate samples, have a good magnitude. On the other hand, if the laser and the sampling rate are not correctly synchronized, such as is shown in FIG. 4B, where there is a 90°-phase shift between the commencement of a laser pulse and of the next sample, each sample samples only a part of the ON and a part of the OFF cycle of the modulated laser beam, such that the integrated signal output will become a constant, at a fraction of the actual level which would be obtained if the laser pulses and samples were synchronized in phase.

Figure 5A:
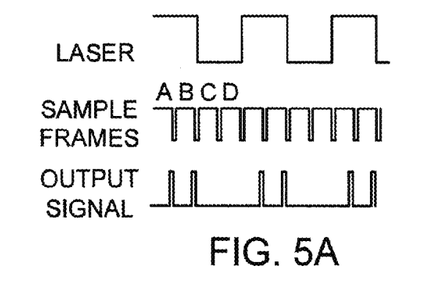
FIGS. 5A and 5B illustrate a method similar to that of FIGS. 4A and 4B, but using a sampling rate of 4 times the modulation frequency.
Figure 5B:
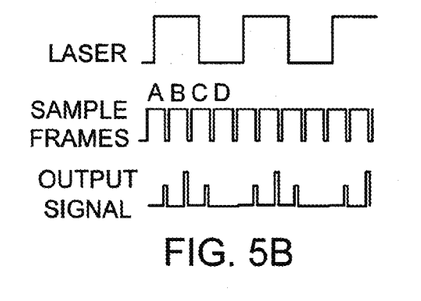

In order to avoid this problem, according to one exemplary method described in this disclosure, a sampling rate at more than the Nyquist criterion is used, such as 4 or more times the modulation frequency. This implementation is illustrated in FIGS. 5A and 5B, where a sampling rate of 4 times the modulation frequency is shown. FIG. 5A shows a situation where the laser modulation and the sampling rate are correctly synchronized. The samples are labeled A, B, C and D. The algorithm used for background suppression is (A+B)−(C+D). Since the background does not change substantially between successive samples, the background detected in samples A and B is substantially the same as that detected in C and D, and therefore subtraction of the C+D signal from the A+B signal will leave the net laser reflected signal, bereft of any background contribution. The detected output signal thus appears in the lower trace as a strong signal at each pulse of the modulated laser. Likewise, if the signals were in opposite phase there would be signal contributions in samples C+D, but not in A+B.

FIG. 5B now shows the same detection scheme but where the laser modulation and the sampling rate have an intermediate phase relation, in this case out of phase by 90°. For this situation, the algorithm used for background suppression is (B+C)−(A+D), and the detected output appears in the lower trace as a series of integrated signals of lower intensity than that of FIG. 5A, but, unlike the situation shown in FIG. 4B, only at the correct occurrence of each pulse of the modulated laser. Likewise, even if the sampling rate is offset by 45° or any other intermediate value from the laser pulse effective phase, the resulting output will be reduced in level, but cannot be lost, unlike the situation shown in FIG. 4B. Therefore, by using a sampling rate of significantly more than twice the laser modulation frequency, the problem of phase synchronization can be reduced.

As an example, if the laser designator is required to be sampled 20 times per second, a sampling rate of 40 Hz would be necessary to fulfill the minimum Nyquist criterion, but in order to avoid the phase cancellation artifacts described above, a significantly higher frequency, such as 80 Hz or more should be used to filter out background light by the method of subtraction of alternate samples described hereinabove.

A modulation frequency of 80 Hz or higher may be fast enough for elimination of a constant background. However, if the background illumination source were moving, such as would be the case if a vehicle were passing through the field of view, it may be detected as a spurious laser reflection, since it may generate frequencies at up to the laser modulation frequency. Two different methods are now described for filtering such moving background signals:

1. Moving objects generate different phased signals in adjacent pixels of the imaging array, as the detected image of the object moves across the field of view from pixel to pixel. By comparing the phase between adjacent pixels or groups of pixels at the detection area, it is possible to differentiate between the laser signal, whose phase remains unchanged between adjacent pixels, and the signal from moving objects, whose phases change.

2. The laser pulses are generally square waves, or close to square waves, and produce a square wave response in each pixel. On the other hand, the output of the image of a moving object entering the pixel will generate a non-square wave shaped signal, whose shape will depend on the edge profile of the moving object. The signal shape can be assessed by performing a Fourier transform on the pixel output. This will differentiate between the laser signal, which has a peak at the modulation frequency, and moving edges, which have components at many frequencies. However, the signal is not ideal square wave. Turbulence might distort its shape and make the shape filtering algorithm more difficult. On the other hand, the background might contain many types of moving objects, some of which may have shapes similar to the laser signal shape. By increasing the modulation rate and the corresponding sampling rate so that they are well beyond the upper limit of frequencies typical of turbulence, which are up to the order of 500-1000 Hz, it is possible to overcome this problem. A frequency in the region of a kHz or more generally adequately accomplishes this. As mentioned hereinabove, in order to increase accuracy and safety, a frequency several times this value is preferably used.

Commercial, megapixel image sensor arrays, both CCD and CMOS types, that can be operated at frame rates of several kHz, are available, and these would provide a good solution for the background filtering methods described above. However, such arrays are currently very expensive or even non-standard, and require complex drive circuitry, and it would certainly be preferable to use standard image sensors, which are less expensive, have lower power consumption and are commonly available. However, standard, low cost sensor arrays have a frame rate of the order of 20 to 30 Hz, as compared with the required kHz rate, so a method must be devised to enable use of such standard sensor arrays in this application.

In order to solve this problem, there is presented another example of an implementation of the systems described in this disclosure, in which use is made of a CCD or a CMOS with pixels having two charge registers that can be alternately filled at a rate in the kHz region. The signal is collected by one charge register, while the background is collected equally by both. Subtracting the two charge registers would filter the background from the signal, as will be now explained. This system can be implemented using either of two different CCD configurations—the interlaced CCD and the interline progressive scan CCD.

Figure 6:
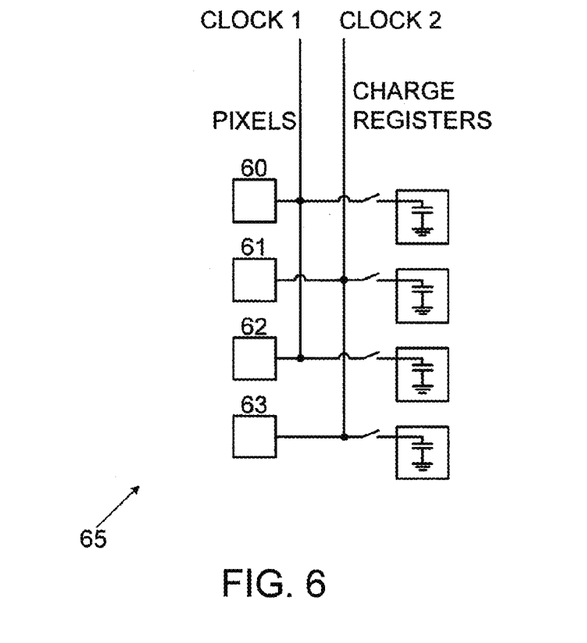
FIG. 6 illustrates schematically an interlaced CCD, configured to filter the background signal from the desired reflected modulated laser signal.

Reference is now made to FIG. 6, which illustrates schematically an interlaced CCD, configured to implement the method of filtering the background signal from the desired reflected modulated laser signal. An interlaced CCD has a different readout clock for the odd rows and for the even rows. The readout clock rate can be synchronized with the modulation rate, which is several kHz in the example system cited herein, so that one of the rows collects the detected laser light including the background, and the other row collects the background only. Subtracting rows then filters the background, leaving the desired reflected modulated laser signal. In FIG. 6, two exemplary pixels 60 and 62 of a complete CCD array 65 are driven by clock 1 and pixels 61 and 63 by clock 2. If the laser modulation is in phase with, for instance, clock 1, the detected laser signals will appear in the register capacitors of pixels 60 and 62. The background will be detected by all of the pixels, 60, 61, 62 and 63. By subtracting the charges in the register capacitors associated with pixels 60 and 62 from those associated with pixels 61 and 63 (or vice versa), the background charges are cancelled, while the signal charges remain. The novelty of this system is that although the individual register capacitors accumulate charges at the rate determined by the modulation pulses of the CW laser, once the charges have accumulated in their respective registers for the frame period of the CCD, they can be read out at the comparatively low frame rate of the standard CCD device. In this way, it is possible to use a standard CCD device, operating typically at a 20 or 30 Hz frame rate, in order to detect the image modulated in the several kHz range.

One disadvantage of this method is that odd and even rows see different images, so that they generate different signals at edges. This problem can be solved by use of special optics or by smoothing methods whereby the image is spread over several pixels. Only interlaced CCD's having odd and even sets of register capacitors can be used for this application.

In a progressive scan CCD, every pixel has its own charge register and the charge capacitors are all read in one action when they have accumulated the desired charge level. Conventional CCD technology shifts the charge in one direction, in order to sweep the detected image charges to the output device. If the device has a progressive scan, the register can be transferred in alternate directions. This feature, shown in FIG. 7, can be used in order to separate the signal detected on alternate pixels, so that for each of the time intervals when the laser modulation signal is successively ON and OFF, or more accurately, in the time intervals when a reflected laser signal is being successively received or not received, a different charge register receives the light. For the laser ON situation, the light and background are transferred to one charge register. For the laser OFF intervals, the background only is transferred to another charge register. Differencing the outputs from these charge registers then provides the received laser light signal only, without the background.

Figure 7:
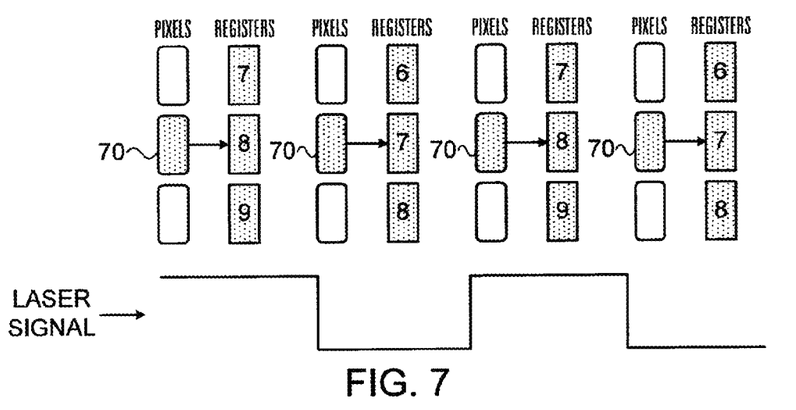
FIG. 7 illustrates schematically a progressive scan CCD, configured to filter the background signal from the desired reflected modulated laser signal.

How this operates in practice is shown in FIG. 7. At the bottom of FIG. 7 there is shown a train of laser pulses received from the reflected light from the filed of view. In the top half of FIG. 7, there is shown the operations performed by the progressive CCD vertical register in order to separately collect the charges from pixel 70, separately for the periods when the laser is ON and the charge arises from the laser illumination and the background, and then for the period when the laser is OFF and the charge arises from the background only. As shown in the leftmost drawing of the top of FIG. 7, when the laser is ON, the charge arising from the laser illumination and the background falling on pixel 70 is transferred to charge register 8. When or immediately before the laser pulse turns OFF, the vertical register is shifted one place, shown in the downwards direction in FIG. 8, and the charge from pixel 80 arising from the background only is transferred to charge register 7. This is shown in the next drawing of the top of FIG. 7. When the laser turns on again, the registers shift back up again, such that the charge from pixel 70 is again added to charge register 8, as shown in the next drawing to the right at the top of FIG. 7. This alternate charge transfer process continues for as many modulation cycles as is necessary to accumulate sufficient charge for the required sensitivity, and the accumulated charges are then swept out of the charge registers during the read-out period. By this means, it is possible to collect the charges from the pulse ON times and the charges from the pulse OFF times separately, and to perform the adding and subtracting operations to separately acquire the complete field of view images and the spot only images, as required by the application.

Figure 8:
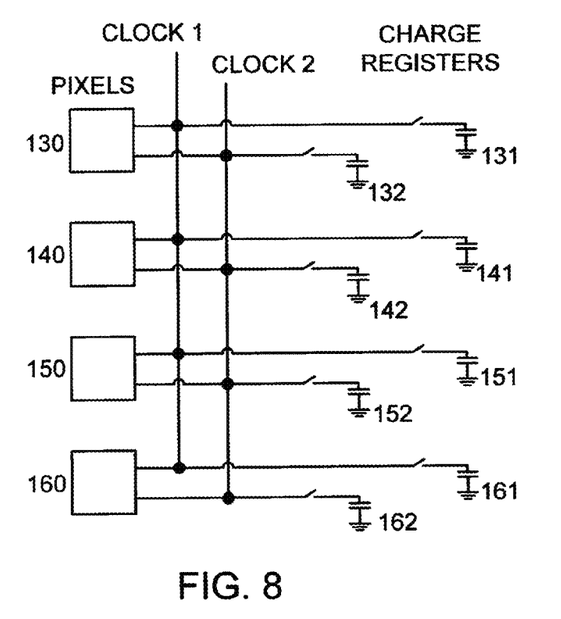
FIG. 8 illustrates a further implementation for extracting the received modulated laser signal from the background level of illumination using an image sensor having two isolated charge registers for every pixel.

This method requires CCD with a different clock for the odd and the even rows. It uses a progressive scan CCD, where every pixel has its own charge register but with interlaced scan capabilities having a different clock for odd and even rows. This system enables the use of a standard interline progressive CCD, and to effectively use filtering at several KHz, but without the need for a more costly image array having a frame rate at that higher speed Reference is now made to FIG. 8 which illustrates a further implementation for extracting the received modulated laser signal reflected from the background level of illumination using a CMOS or CCD image sensor having two isolated charge registers for every pixel. Such devices have been used generally for achieving a high dynamic range. Switching between the separate charge registers at the laser modulation rate, enables these advantages to be obtained, the reflected laser light together with the background level being stored in one charge register, and the background only in the other. In FIG. 8, when the laser pulse is on, an enabling signal is supplied from the clock 1 input, closing the switches to charge registers 131, 141, 151 and 161 such that charges arising from the laser illumination together with the background are transferred from pixels 130, 140, 150 and 160 to charge registers 131, 141, 151 and 162 respectively. When the laser is off, clock 2 input is activated, and the charges arising from the background only are transferred to charge registers 132, 142, 152 and 162 respectively. By taking the difference between the outputs of the two charge registers of each pixel, the reflected laser signal of each pixel without the background is obtained. As with the previous cases, the detected illumination signals are sampled at the laser modulation rate, which could be in the kHz range, while the pixel readout is performed at the much slower CMOS or CCD sensor frame rate, in the tens of Hz range.

It is to be understood that the previously mentioned division of pixels into odd and even pixels is not meant to be a strict delineation, but that it is also possible to use CCD arrays in which pixel reading is performed alternately for sets of pixels, each set containing a pair of pixels, or even more than a pair. When using such detector arrays, the shift will be not by a single pixel, but rather according to the number of pixels in the sets.

For some tracking applications such as missile or smart-bomb guidance, different regions of interest (ROI) for different target distances may be required. At the target seeking phase, when the imaging system does not know where the designated spot is in the entire imaging field of view, a large ROI is required in order to be able to find the designated target. During this phase the missile or bomb does not perform any maneuvers but simply follows its initial launched course. The detection system can thus use a long integration time, sampling many pulses and thus have a high detection sensitivity before the accumulated odd and even signals are read out for generating the desired image. Once the designated target spot has been acquired, the missile or bomb begins to maneuver in order to ensure arrival at the designated target, and since its speed is high, these maneuvers must be performed rapidly. In order to be able to operate more rapidly, a configuration is suggested in the systems of the present application, whereby the imager concentrates on a smaller ROI, by using a regional filter to reduce the field of view. Use of positional anticipating routines enables the system to anticipate where the designated spot will be in the smaller selected field of view, by taking into account the motion characteristics of the missile or bomb. Since the field of view is smaller, a smaller number of pixels need to be sampled, such that the sampling rate can be increased, thus enabling a higher tracking rate yet without losing positional accuracy.

As mentioned hereinabove, prior art designating systems used high peak power, short pulsed solid state lasers. For backward compatibility the proposed receiver should also be able to detect this prior art type of laser designator also. Prior art systems have not been able to capture the laser designator spot on a camera image of the complete field of view. The pulse duration of such pulsed lasers, however, being of the order of typically tens of nanoseconds, is orders of magnitude shorter than the charge register transfer rate presented above, of tens of milliseconds. However since the repetition rate is similar to that of the pulse rate of the pulsed CW lasers described in the previous implementations of this disclosure, it is clear that each short pulse will be detected within a single charge transfer, such that the charge arising from it will be transferred to a single charge register, odd or even, while the charge arising from the background will be transferred to both odd and even charge registers, and can thus be readily subtracted out. Thus the systems described herewithin can be used to detect the reflected illumination from prior art, short pulsed lasers. In order to determine the coding of such a prior art short pulse stream, which is performed as PPM (Pulse Phase Modulation) coding involving differences in the timing of the pulses of microseconds, it is necessary to perform time manipulations of the detection scheme.

Guided arming is frequently required to have special coding that will differentiate between different designations. This is essential where different forces are operating in the same region, each using designators for its own targets, and it is therefore important that the different designators be differentiated from each other, even when operating simultaneously. By this code each designator can be locked on its specific designation code without being disturbed by other laser designators. In the proposed system, the arming coding can be implemented by setting different laser modulation frequencies and corresponding image sensor charge register transferring rates to different systems. The frequency shift between different designators shall be designed so that there will be no interference between different systems by use of zero nodes of orthogonal disposition.

The effect of sampling of many cycles of the received laser pulses is effective to applying a filter to the incoming pulses, where the bandwidth of the filter is a function of the number of cycles sampled. The larger the number of cycles sampled, the narrower the bandwidth of the signal filter. A simplified expression for the bandwidth is that it is the frequency divided by the number of cycles sampled. Thus, for a 1 kHz modulation rate and a sampling size of 100 cycles, the effective bandwidth of the receiver is 10 Hz. Thus, a laser operating at beyond 1010 Hz will be outside of the bandwidth of the receiver, and will not be detected, or more accurately, will be detected at a much attenuated level. However, in order to ensure that any other coded laser will not be detected at all, use is made of the exact form of the equivalent bandpass filter which the receiver represents. It has the form of sin c(x) where x is the frequency deviation from the center frequency of the filter. Since the form of sin c(x) has nodes at equally spaced frequencies where sin(x) is zero, the power transmitted by the filter at each of these nodes falls to zero. Therefore, by positioning the various laser sampling codes at the zero's of this function, the power of a specifically modulated laser beam detected by any of the other receivers having a different sampling rate is essentially zero.

The systems described in this application, which operate by filtering out the background radiation from the laser signal can be used to implement laser pointing even in daylight conditions. During darkness, covert laser pointing can be simply performed by aiming an infrared laser beam at the target to the designated, and surveilling the field of view using an infrared viewing device, such as an SLS or an IR image intensifier device. However during the daytime, such a simple solution becomes impossible because of the large background illumination reflected from the field of view. Using the systems described in this disclosure enable such daylight pointing to be achieved because of the cancellation of the signals arising from the background illumination. Thus, the pointer can designate a target using a predetermined pulse code, and any other observer having a receiver and knowledge of the code, can immediately detect the target designated by the pointer. The indicated target may be presented by video means for operator use.

A further use of the modulated CW pulsed laser transmitter and receiver systems described hereinabove is as an optical data link. The receiver, once it has detected the coded transmission from a remote transmitter, is able to synchronize on the transmitted pulses. Once such synchronization has been achieved, the phase of the pulses of laser are then known, and it is possible to transfer digital information between the transmitter and the receiver by means of adjusting the laser modulation such that successive pulses are present or not. Thus the signal can be directed to either the odd or the even registers by changing the phase of the transmitted pulse at the time of that particular sample. Selection of when to change the presence of the pulse or not can therefore constitute a bpsk (binary phase shift keying) data stream, using successive frames to transfer the data in a digital form between a modulated CW laser source and an optical receiver of the type described hereinabove.

The systems of the present disclosure can also be used in order to determine the range of the target designated. Consider a modulated CW laser beam projected at an object in the field and the reflected illumination detected. The difference in phase between the transmitted pulse and the pulse received arises from the transit time of the laser pulse to and from the target, and can be used to determine the range of the target. Considering the case where the beam is modulated at a frequency of 1 MHz. Such a frequency, of at least in the MHz range, is required in order to be able to measure a range in a typical combat area without undue ambiguity. A transit time difference between successive 1 MHz pulses is equivalent to a to-and-fro optical transmitted distance of 150 meters. A lower frequency would mean an increased effective to-and-fro transmitted distance which would limit the accuracy of the range measurement within that distance range, while a higher frequency would increase the accuracy of the measurement, but at the same time would shorten the useful measurement range, because of the shortening of the repetition distance ambiguity resulting from the inability to distinguish how many of such ranges have given rise to the phase change of the reflected illumination being measured. However it is very difficult to accurately measure phase differences in the MHz frequency range, in a system inputting information generated from millions of pixels of an imaging array. The amount of information to be processed in order to measure the phase difference at every pixel is immense. Therefore it is necessary for the receiver to convert the CW laser modulation frequency to a value more manageable in order to be able to readily measure the phase difference between the transmitted and received pulses.

Figure 9:
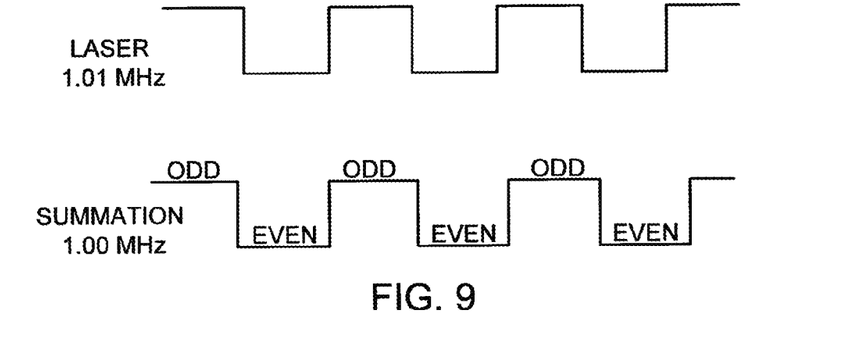
FIG. 9 shows time graphs of a received laser beam modulated at one frequency, and a CCD sampled at a slightly different frequency in order to enable range measurements to be performed.

As is observed in FIGS. 5A-5B, regardless of the sampling rate, the output signal including the reflected laser pulse is present during the time when the laser pulse is received on the pixel being read. Referring now to FIG. 9, there is shown schematically in the upper section of the drawing, a train of laser pulses resulting from a 1.01 MHz modulation of the CW laser diode, received by reflection from an object in the field whose range is to be determined. In order to perform the range measurement according to this system, the receiver sampling or summing rate is maintained at a slightly different frequency, which for the example shown in FIG. 9, could typically be 1.00 MHz. Such a sampling pattern is shown in the bottom trace of FIG. 9, where the alternate sampling periods are nominally labeled ODD or EVEN. The difference between the two time traces has been exaggerated in FIG. 9, to illustrate the process. As previously, when readout is performed, the differences between the output signal (ODD) and the "non-output" signal (EVEN) provides the laser signal without the effect of the background illumination. In order to simplify the explanation, the effect of the background illumination will now be ignored, and the signals referred to simply as the laser signals.

During the first ODD sample shown on the left hand side of FIG. 9, the sampling period and the laser signal exactly overlap, and the full level of output signal is obtained. At the second ODD sample, there has been a small time shift between the 1.01 MHz laser pulse and the 1.00 MHz sampling period, such that part of the laser signal is not sampled, and the output signal is thus smaller. This process continues until the laser pulse and the sampling period are in opposite phases, namely that the laser pulse falls on the EVEN non-output sampling period, and the output signal has thus fallen to zero. After another equal number of sampling periods, the laser pulse and the ODD sampling periods are again in phase, and the output signal returns to its maximum value. This occurs after a time equivalent to the period of a 10 kHz waveform, this being the frequency difference between the laser modulation train, and the sampling rate, i.e. after 0.1 msec. Expressed more rigorously, since the 1.01 MHz received signals are sampled at a 1.00 MHz rate, the resulting output is a signal modulated at 10 kHz, and having a sinusoidal shape.

Figure 10:
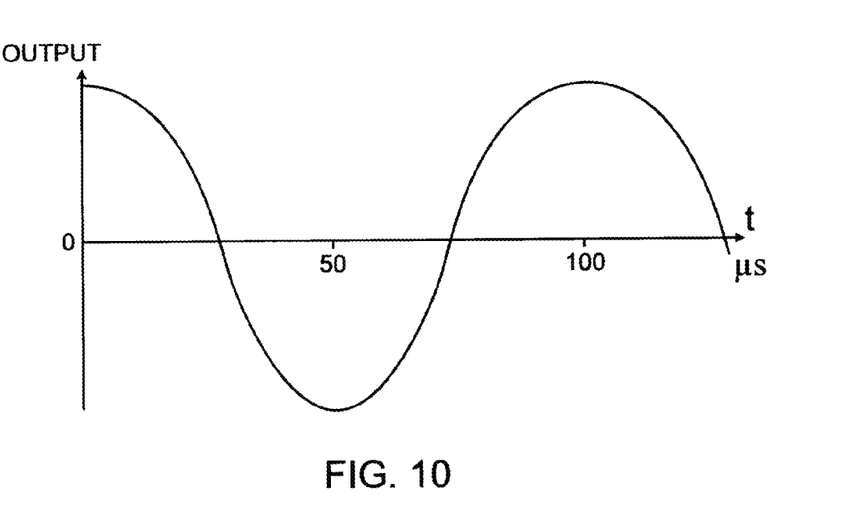
FIG. 10 is a schematic graph of the output signal obtained from the range measurement scheme described in FIG. 9.

FIG. 10 illustrates schematically how the output varies sinusoidal with time, having a period of 100 μsec. Thus the laser image signal read-out will fluctuate at the difference frequency of 10 kHz. The importance of this summation procedure in the receiver is that, like heterodyne detection in a radio receiver, the signal information in the received 1 MHz modulated laser beam is impressed onto the 10 kHz detected signal envelope, and can be obtained therefrom. Thus, the phase shift information arising from the time difference between transmission and reception of the 1.01 MHz laser pulses, can be measured from the 10 kHz envelope. Unlike a direct measurement at 1 MHz, determination of an accurate phase difference at 10 kHz can be readily performed electronically even for the large numbers of pixels within the arrays used.

The range measurement of the point designated by the laser beam is obtained from the change in phase which the 10 kHz received signal has undergone, relative to a 10 kHz signal generated from the transmitted laser signal at the point in time at which the laser pulse was transmitted.

This procedure may be performed, as described previously in relation to FIGS. 6 to 8, by measuring the readout from the registers after the charge from a number of pulses have been accumulated in the charge registers. Thus, for example, the register readout may be performed after every 16 pulses, this being equivalent to a sampling rate of 62.5 kHz for the 1 MHz modulated beam. Since this too may not be a readily managed data rate for readout of all of the pixels in a multi-megapixel CCD or CMOS array, a regional filter can be used to process just those pixels in the region at which the laser reflections have been detected. By this means, the data from a more manageable number of pixels can be readily handled at the 62.5 kHz sampling rate. Once this data has been obtained, the phase difference between the transmitted laser pulses and the received laser pulses can be readily obtained for every pixel being sampled in the region of interest, from the shift of the 10 kHz envelope signal.

This range measurement technique can also be applied to the munitions guidance head itself. The transmitter in the guidance head then continuously measures the distance to the target designating spot by means of the laser beam reflected back to the guidance head receiver. Use of this dynamic range parameter enables accurate trajectory corrections to be made, and for accurate destination of devices at standoff distances from their target.

It is appreciated by persons skilled in the art that the present invention is not limited by what has been particularly shown and described hereinabove. Rather the scope of the present invention includes both combinations and sub-combinations of various features described hereinabove as well as variations and modifications thereto which would occur to a person of skill in the art upon reading the above description and which are not in the prior art.

We claim:

1. A method of imaging a field of view, the method comprising:
    illuminating the field of view by means of a continuous wave (CW) laser, modulated at a first rate to provide a stream of laser pulses;
    imaging the field of view using a multi-pixel sensor array;
    accumulating signals obtained from pixels of said multi-pixel sensor array during detection of a predetermined plurality of said laser pulses reflected from said field of view in a first set of pixel signal accumulators, to obtain from those pixels a first set of accumulated pixel signals arising from said predetermined plurality of said reflected laser pulses;
    reading out said first set of accumulated pixel signals to image said field of view, after completion of detection of said predetermined plurality of laser pulses; and
    repeating the accumulating of signals obtained from pixels of said multi-pixel sensor array for further durations of said predetermined plurality of laser pulses, to obtain further sets of accumulated pixel signals, and reading out said further sets of accumulated pixel signals at a second rate significantly lower than said first rate.

2. The method according to claim 1, wherein said first rate is varied according to a predetermined coding scheme.

3. The method according to claim 1, wherein said accumulating is performed in charge registers of a multi-pixel CCD or CMOS array.

4. The method according to claim 1, wherein said first rate is higher than an expected environmental rate of change in said imaged field of view.

5. The method according to claim 4, where said expected environmental rate of change in said imaged field of view is that arising from any of natural movements, personnel movements, vehicular movements or atmospheric turbulence occurring in said field of view.

6. The method according to claim 1, wherein said second rate is sufficiently low that it is compatible with a frame rate of standard CCD or CMOS devices.

7. The method according to claim 1, wherein said second rate is in the tens of Hz. range.

8. The method according to claim 1, further comprising a step of accumulating signals obtained from said pixels of said multi-pixel sensor array in periods between the detection of laser pulses reflected from said field of view, in a second set of pixel signal accumulators, for said duration of said predetermined plurality of pulses, to obtain from those pixels of said multi-pixel sensor array a second set of accumulated pixel signals; and
    reading out said second set of accumulated pixel signals after completion of said predetermined plurality of pulses.

9. The method according to claim 8, wherein said first and said second sets of accumulated pixel signals are read out separately after completion of said predetermined plurality of pulses, at said second rate significantly lower than said first rate.

10. The method according to claim 8, wherein said first and second sets of pixel signal accumulators are sets of charge registers of an interlaced CCD or CMOS image sensor, with said first set being associated with charges collected from said pixels of said multi-pixel sensor array, arising from laser pulses reflected from said field of view and said second set being associated with charges collected from said pixels of said multi-pixel sensor array in periods between the detection of pulses reflected from said field of view.

11. The method according to claim 8, wherein said first and second sets of pixel signal accumulators are sets of charge registers of a CMOS or CCD image sensor, each pixel of said multi-pixel sensor array having two isolated charge sensors, with said first set being associated with charges collected from said pixels of said multi-pixel sensor array arising from laser pulses reflected from said field of view, and said second set being associated with charges collected from said pixels of said multi-pixel sensor array in periods between the detection of laser pulses reflected from said field of view.

12. The method according to claim 8, wherein said first and second sets of pixel signal accumulators are sets of adjacent charge registers of a progressive scan CMOS or CCD image sensor, the signal from each pixel of said multi-pixel sensor array being accumulated in either of said two sets of adjacent charge registers according to a shifted position of the vertical register, with said first set being associated with charges collected from said pixels of said multi-pixel sensor array arising from laser pulses reflected from said field of view, and said second set being associated with charges collected from said pixels of said multi-pixel sensor array in periods between detection of laser pulses reflected from said field of view.

13. The method according to claim 8, wherein said pixel signals accumulated in each of said first and second sets of pixel signal accumulators and read out therefrom, are subtracted, to generate image signals of said field of view in which an effect of background illumination is subtracted out.

14. The method according to claim 13, wherein said subtraction of the effect of background illumination enables a point of impingement of said stream of laser pulses to be determined in said image of said field of view, even if said background illumination dominates the intensity of said point of impingement of said stream of laser pulses.

15. The method according to claim 14, further comprising the step of:
adding said signals accumulated in said first and second sets of signal accumulators and read out therefrom, to provide an additive image of said field of view; and
impressing on said additive image of said field of view, said image of said field of view with the point of impingement of said laser pulses accentuated therein, to obtain an indication of the position of impingement of said laser pulses on an image of said field of view.

16. The method according to claim 1, wherein said continuous wave (CW) laser is a diode laser.

17. A method for determining a range of an object, comprising:
illuminating the object by means of a continuous wave (CW) laser, modulated at a first rate to provide a stream of transmitted laser pulses;
imaging the field of view using a multi-pixel sensor array;
accumulating signals obtained from pixels of said multi-pixel sensor array during detection of a predetermined plurality of said laser pulses reflected from said field of view at a second rate differing from the first rate by substantially less than either of said first and said second rates, to obtain from said pixels of said multi-pixel sensor array a first set of accumulated pixel signals arising from said predetermined plurality of said reflected laser pulses modulated at the rate equal to the difference between the first and second rates;
reading out said first set of accumulated pixel signals after completion of said predetermined plurality of laser pulses;
repeating said steps of accumulating and reading out for further durations of said predetermined plurality of pulses, to obtain further sets of accumulated pixel signals arising from said reflected laser pulses; said reading out of said further sets of accumulated pixel signals being performed at a rate significantly lower than that of said first rate;
obtaining from said repeated accumulating and reading out, a train of image signal outputs of said object modulated at a rate equal to the difference between said first and second rates; and
determining the range of said object from the difference in phase detected between said train of image signal outputs of said object and said modulated stream of transmitted laser pulses, said determining being performed at a rate equal to the difference between the first and second rates.

18. The method according to claim 17, wherein said difference between said first and second rates is sufficiently small that said phase difference can be measured electronically concurrently for millions of pixels of an imaging array.

19. The method according to claim 17, wherein said accumulating of pixel signals is performed in the charge registers of a multi-pixel CCD or CMOS array.

20. The method according to claim 17, wherein said reading out rate is sufficiently low that it is compatible with the frame rate of standard CCD or CMOS devices.

21. The method according to claim 17, wherein said second rate is in the tens of Hz. range.

22. The method according to claim 17, wherein said continuous wave (CW) laser is a diode laser.

* * * * *